(12) United States Patent
Harada et al.

(10) Patent No.: US 11,359,072 B2
(45) Date of Patent: Jun. 14, 2022

(54) DISPERSION LIQUID, COMPOSITION, SEALING MEMBER, LIGHT-EMITTING DEVICE, ILLUMINATION TOOL, DISPLAY DEVICE, AND METHOD FOR PRODUCING LIGHT-EMITTING DEVICE

(71) Applicant: SUMITOMO OSAKA CEMENT CO., LTD., Tokyo (JP)

(72) Inventors: Kenji Harada, Tokyo (JP); Takeshi Otsuka, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 266 days.

(21) Appl. No.: 16/626,335

(22) PCT Filed: Aug. 1, 2018

(86) PCT No.: PCT/JP2018/028845
§ 371 (c)(1),
(2) Date: Dec. 24, 2019

(87) PCT Pub. No.: WO2019/026956
PCT Pub. Date: Feb. 7, 2019

(65) Prior Publication Data
US 2020/0115530 A1  Apr. 16, 2020

(30) Foreign Application Priority Data
Aug. 4, 2017 (JP) .............................. JP2017-151680

(51) Int. Cl.
C08K 9/06 (2006.01)
C09C 3/10 (2006.01)
H01L 33/56 (2010.01)

(52) U.S. Cl.
CPC ............... *C08K 9/06* (2013.01); *C09C 3/10* (2013.01); *H01L 33/56* (2013.01); *H01L 2933/005* (2013.01)

(58) Field of Classification Search
CPC .............. C08K 9/06; H01L 33/56; C09C 3/12
See application file for complete search history.

(56) References Cited

U.S. PATENT DOCUMENTS

| | | | |
|---|---|---|---|
| 2010/0256312 A1 | 10/2010 | Ozaki et al. | |
| 2012/0119230 A1* | 5/2012 | Chan | G02B 6/0073 257/88 |
| 2013/0253161 A1 | 9/2013 | Amako et al. | |
| 2017/0306161 A1* | 10/2017 | Morita | C01G 25/02 |
| 2018/0030305 A1* | 2/2018 | Morita | C09D 17/008 |

FOREIGN PATENT DOCUMENTS

| | | | |
|---|---|---|---|
| CN | 103347960 | | 10/2013 |
| JP | 2007299981 | | 11/2007 |
| JP | 2010241935 | | 10/2010 |
| JP | 2012214339 | | 11/2012 |
| JP | 2015081275 | | 4/2015 |
| JP | 2016020431 | | 2/2016 |
| JP | 2016033101 | | 3/2016 |
| WO | 2015046487 | | 4/2015 |
| WO | 2016035689 | * | 3/2016 |
| WO | 2016136763 | * | 9/2016 |

OTHER PUBLICATIONS

"International Search Report (Form PCT/ISA/210) of PCT/JP2018/028845," dated Sep. 11, 2018, with English translation thereof, pp. 1-3.

* cited by examiner

*Primary Examiner* — Kuo Liang Peng
(74) *Attorney, Agent, or Firm* — JCIPRNET

(57) ABSTRACT

Provided is a dispersion liquid for sealing a light-emitting element containing metal oxide particles having a refractive index of 1.7 or higher and a surface-modifying material at least partially attached to the metal oxide particles, in which a particle diameter D50 of the metal oxide particles when a cumulative percentage of a scattering intensity distribution obtained by a dynamic light scattering method is 50% is 30 nm or more and 100 nm or less, and a value D50/D90 obtained by dividing the particle diameter D50 of the metal oxide particles when the cumulative percentage of the scattering intensity distribution is 50% by a particle diameter D90 of the metal oxide particles when the cumulative percentage of the scattering intensity distribution is 90% is 0.20 or more.

10 Claims, 2 Drawing Sheets

DISPERSION LIQUID, COMPOSITION, SEALING MEMBER, LIGHT-EMITTING DEVICE, ILLUMINATION TOOL, DISPLAY DEVICE, AND METHOD FOR PRODUCING LIGHT-EMITTING DEVICE

CROSS-REFERENCE TO RELATED APPLICATION

This application is a 371 application of the international PCT application serial no. PCT/JP2018/028845, filed on Aug. 1, 2018, which claims the priority benefit of Japan application no. 2017-151680, filed on Aug. 4, 2017. The entirety of each of the abovementioned patent applications is hereby incorporated by reference herein and made a part of this specification.

TECHNICAL FIELD

The present invention relates to a dispersion liquid including metal oxide particles having a refractive index of 1.7 or higher to which a surface-modifying material is attached, a composition, a sealing member, a light-emitting device, an illumination tool, a display device, and a method for producing a light-emitting device.

BACKGROUND ART

As a light source having advantages such as a small size, a long service life, and low-voltage driving, light-emitting diodes (LED) are being broadly used. An LED chip in an LED package is generally sealed with a sealing material including a resin in order to prevent the contact with a deterioration factor present in the external environment such as oxygen or moisture. Therefore, light emitted from the LED chip passes through the sealing material and is released outwards. Therefore, it becomes important to efficiently extract the light emitted from the LED chip to the outside of the LED package in order to increase the luminous flux emitted from the LED package.

As the sealing material for improving the extraction efficiency of light emitted from the LED chip, a composition containing inorganic oxide particles having a dispersed-particle diameter of 1 nm or more and 20 nm or less and a refractive index of 1.8 or more and a silicone resin is proposed (Patent Literature 1).

In this composition, a dispersion liquid including the inorganic oxide particles having a small dispersed-particle diameter and a high refractive index are mixed into the silicone resin. Therefore, the inorganic oxide particles in the dispersion liquid are capable of improving the refractive index of the sealing material and capable of suppressing the total reflection of light on an interface between the LED chip and the sealing material when light emitted from the LED chip enters the sealing material. In addition, the dispersed-particle diameters of the inorganic oxide particles are small, and thus the degradation of the transparency of the sealing material is suppressed. As a result, it is possible to improve the extraction efficiency of light from the LED chip.

CITATION LIST

Patent Literature

[Patent Literature No. 1] Japanese Laid-open Patent Publication No. 2007-299981

SUMMARY OF INVENTION

Technical Problem

However, in order to further increase the luminous flux emitted from a light-emitting device such as an LED package, there has been a demand for additional improvement in the extraction efficiency of light.

The present invention has been made solve the above-described problem, and the present invention provides a dispersion liquid which is capable of improving the extraction efficiency of light from a light-emitting device and including metal oxide particles having a refractive index of 1.7 or more to which a surface-modifying material is attached, a composition containing the dispersion liquid, a sealing member being formed using the composition, a light-emitting device having this sealing member, an illumination tool and a display device including this light-emitting device, and a method for producing a light-emitting device.

Solution to Problem

The gist of the present invention provided in order to solve the above-described problem is mainly as described below.

(1) A dispersion liquid for sealing a light-emitting element containing metal oxide particles having a refractive index of 1.7 or higher and a surface-modifying material at least partially attached to the metal oxide particles, in which a particle diameter D50 of the metal oxide particles when a cumulative percentage of a scattering intensity distribution obtained by a dynamic light scattering method is 50% is 30 nm or more and 100 nm or less, and a value D50/D90 obtained by dividing the particle diameter D50 of the metal oxide particles when the cumulative percentage of the scattering intensity distribution is 50% by a particle diameter D90 of the metal oxide particles when the cumulative percentage of the scattering intensity distribution is 90% is 0.20 or more.

(2) The dispersion liquid according to (1), in which a content of the surface-modifying material not attached to the metal oxide particles is 53% by mass or less with respect to a total content of the metal oxide particles and the surface-modifying material.

(3) The dispersion liquid according to (1) or (2), in which a content of the surface-modifying material not attached to the metal oxide particles is 20% by mass or more with respect to a total content of the metal oxide particles and the surface-modifying material.

(4) The dispersion liquid according to any one of (1) to (3), in which the metal oxide particles include zirconium oxide particles and/or titanium oxide particles.

(5) The dispersion liquid according to any one of (1) to (4), in which an average primary particle diameter of the metal oxide particles is 3 nm or more and 20 nm or less.

(6) A composition for sealing a light-emitting element which is obtained by mixing the dispersion liquid according to any one of (1) to (5) and a resin component.

(7) A sealing member which is a cured substance of the composition according to (6).

(8) A light-emitting device including the sealing member according to (7) and a light-emitting element sealed by the sealing member.

(9) An illumination tool including the light-emitting device according to (8).

(10) A display device including the light-emitting device according to (8).

(11) A method for producing a light-emitting device including a step of sealing a light-emitting element using the composition according to (6).

(12) A method for producing a light-emitting device including a step of obtaining a composition by mixing the dispersion liquid according to any one of (1) to (5) and a resin component and a step of sealing a light-emitting element using the composition.

Advantageous Effects of Invention

Hitherto, according to the present invention, it is possible to provide a dispersion liquid which is capable of improving the extraction efficiency of light from a light-emitting device and including metal oxide particles having a refractive index of 1.7 or more to which a surface-modifying material is attached, a composition containing the dispersion liquid, a sealing member being formed using the composition, a light-emitting device having this sealing member, an illumination tool and a display device including this light-emitting device, and a method for producing a light-emitting device.

DESCRIPTION OF EMBODIMENTS

Figure 1:
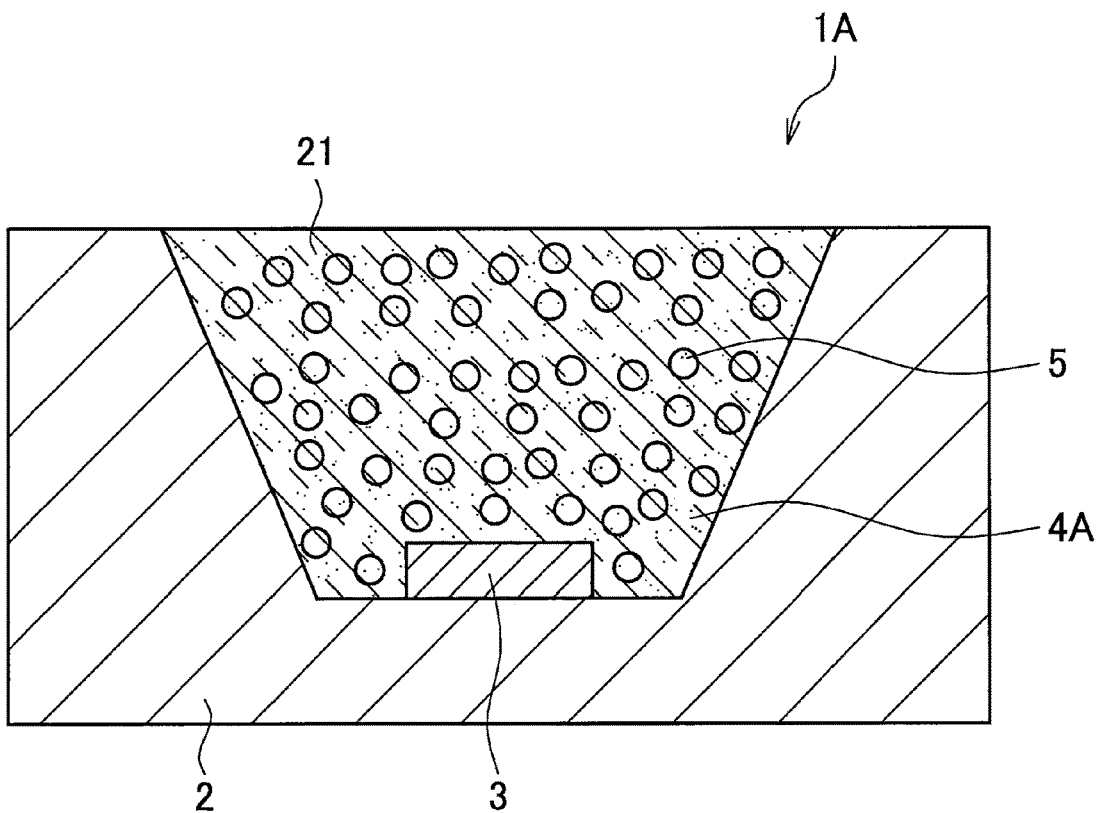
FIG. 1 is a schematic view showing an example of a light-emitting device according to an embodiment of the present invention.

Hereinafter, a preferred embodiment of the present invention will be described in detail with reference to the accompanying drawings.

<1. Dispersion Liquid>

A dispersion liquid according to the present embodiment is mixed with a resin component as described below to be used for the sealing of a light-emitting element as a sealing member in the light-emitting device. The dispersion liquid according to the present embodiment contains metal oxide particles having a refractive index of 1.7 or higher and a surface-modifying material at least partially attached to the metal oxide particles.

(1.1 Metal Oxide Particles)

The metal oxide particles included in the dispersion liquid according to the present embodiment has a refractive index of 1.7 or more and improves the refractive index of the sealing member. In addition, the metal oxide particles are used for the scattering of light in the sealing member as described below.

The metal oxide particles used in the present embodiment are not particularly limited as long as the metal oxide particles have a refractive index of 1.7 or more. The refractive index of the metal oxide particles is preferably 1.8 or more, more preferably 1.9 or more, and still more preferably 2.0 or more from the viewpoint of improving the refractive index of the sealing member and improving a light-scattering effect.

As the metal oxide particles having a refractive index of 1.7 or more which include one metal element, for example, one or more selected from the group consisting of zirconium oxide particles, titanium oxide particles, zinc oxide particles, iron oxide particles, aluminum oxide particles, copper oxide particles, tin oxide particles, yttrium oxide particles, cerium oxide particles, tantalum oxide particles, niobium oxide particles, molybdenum oxide particles, indium oxide particles, antimony oxide particles, germanium oxide particles, lead oxide particles, bismuth oxide particles, tungsten oxide particles, europium oxide particles, and hafnium oxide particles are preferably used.

As the metal oxide particles having a refractive index of 1.7 or more which include two metal elements, for example, one or more selected from the group consisting of potassium titanate particles, barium titanate particles, strontium titanate particles, potassium niobate particles, lithium niobate particles, calcium tungstate particles, yttria-stabilized zirconia particles, alumina-stabilized zirconia particles, silica-stabilized zirconia particles, calcia-stable zirconia particles, magnesia-stabilized zirconia particles, scandia-stabilized zirconia particles, hafnia-stabilized zirconia particles, ytterbia-stabilized zirconia particles, ceria-stabilized zirconia particles, india-stabilized zirconia particles, strontium-stabilized zirconia particles, samarium oxide-stabilized zirconia particles, gadolinium oxide-stabilized zirconia particles, antimony-added tin oxide particles, and indium-added tin oxide particles are preferably used. Metal oxide particles including three or more metal elements can also be used as long as the refractive index is 1.7 or more. In addition, the above-described metal oxide particles including one or more metal elements may also be used in combination.

Among these metal oxide particles, from the viewpoint of obtaining a dispersion liquid having a high refractive index and high transparency, as the metal oxide particles, zirconium oxide particles and/or titanium oxide particles are preferably included, and zirconium oxide particles are more preferably included.

In addition, in the present embodiment, the particle diameter D50 of the metal oxide particles (the metal oxide particles to which the surface-modifying material is attached) when the cumulative percentage of the scattering intensity distribution obtained by the dynamic light scattering method is 50% is 30 nm or more and 100 nm or less, and a value (D50/D90) obtained by dividing the particle diameter D50 of the metal oxide particles (the metal oxide particles to which the surface-modifying material is attached) when the cumulative percentage of the scattering intensity distribution is 50% by the particle diameter D90 of the metal oxide particles (the metal oxide particles to which the surface-modifying material is attached) when the cumulative percentage of the scattering intensity distribution is 90% is 0.20 or more.

The reason for the particle diameter D50 (hereinafter, also simply referred to as "D50") of the metal oxide particles when the cumulative percentage of the scattering intensity distribution obtained by the dynamic light scattering method is 50% being 30 nm or more and 100 nm or less in the present embodiment is as described below.

In the related art, it was considered that, in order to improve the extraction efficiency of light, the transparency (transmittance) of a composition that is used as a sealing material is preferably high. Therefore, it was considered that D50 of the metal oxide particles in a dispersion liquid is preferably as small as possible.

However, the present inventors found that, when D50 of the metal oxide particles in the dispersion liquid is set to 30 nm or more and 100 nm or less, and light released from a light-emitting element is scattered in the sealing member or the composition to a large extent, even in a case where the transparency of the dispersion liquid or the composition somewhat degrades, the extraction efficiency of light in the sealing member improves.

From the viewpoint of further improving the extraction efficiency of light, D50 of the metal oxide particles is preferably 30 nm or more and 80 nm or less and more preferably 30 nm or more and 70 nm or less.

In a case where D50 is less than 30 nm, the light-scattering effect cannot be sufficiently obtained, and, in a case where a composition described below is used as the sealing material, the extraction efficiency of light becomes small, which is not preferable. On the other hand, in a case where D50 exceeds 100 nm, the transmittance of the composition described below becomes too low, and, in a case where the composition is used as the sealing material, the extraction efficiency of light becomes small, which is not preferable.

In addition, the reason for the value D50/D90 obtained by dividing the particle diameter D50 of the metal oxide particles by a particle diameter D90 of the metal oxide particles when the cumulative percentage of the scattering intensity distribution is 90% being 0.20 or more in the dispersion liquid of the present embodiment is as described below.

Even when D50 of the metal oxide particles in the dispersion liquid is 30 nm or more and 100 nm or less, in a case where D50/D90 is less than 0.20, that is, the particle size distribution is broad, a small amount of coarse particles present block light, and thus the extraction efficiency of light decreases. In addition, an increase in less than 30 nm particles results in the generation of metal oxide particles not contributing to the scattering of light. The present inventors found that, when the particle size distribution of the dispersion liquid is set to be narrow as described above, that is, D50/D90 is set to 0.20 or more, it is possible to increase the extraction efficiency of light in the case of using a composition described below as a sealing material.

The upper limit value of D50/D90 is 1; however, realistically, it is difficult to obtain a monodisperse dispersion liquid. Therefore, D50/D90 may be, for example, 0.90 or less or 0.80 or less.

D50 and D90 of the metal oxide particles can be measured using a particle size distribution meter (for example, manufactured by Horiba, Ltd., model No.: SZ-100SP). The measurement can be carried out on the dispersion liquid having a solid content adjusted to 5% by mass as a subject using a silica cell having a 10 mm×10 mm light path length. In the present specification, the "solid content" refers to a residue when a volatile component is removed from the dispersion liquid. For example, when the dispersion liquid (1.2 g) is put into a magnetic crucible and heated at 150° C. for one hour on a hot plate, a component that does not volatilize but remains (the metal oxide particles, the surface-modifying material, or the like) can be regarded as the solid content.

D50 and D90 of the metal oxide particles in the present embodiment are values that are measured and calculated on the basis of the dispersed-particle diameters of the metal oxide particles in the dispersion liquid. D50 and D90 are measured and calculated on the basis of the diameters of the metal oxide particles in a dispersed state regardless of whether the dispersed metal oxide particles are in a primary particle or secondary particle state. In addition, in the present embodiment, D50 and D90 of the metal oxide particles may be measured as D50 and D90 of the metal oxide particles to which the surface-modifying material is attached. In the dispersion liquid, the metal oxide particles to which the surface-modifying material is attached and the metal oxide particles to which the surface-modifying material is not attached may be present, and thus, generally, D50 and D90 of the metal oxide particles is measured as a value in a state both kinds of the metal oxide particles are mixed together.

The average primary particle diameter of the metal oxide particles is, for example, 3 nm or more and 20 nm or less, preferably 4 nm or more and 20 nm or less, and more preferably 5 nm or more and 20 nm or less. When the average primary particle diameter is in the above-described range, it becomes easy to control D50 to 30 nm or more and 100 nm or less.

Regarding a method for measuring the average primary particle diameter, a predetermined number, for example, 100 metal oxide particles are selected. In addition, the longest straight-line segments (longest diameters) of the respective metal oxide particles are measured, and these measurement values are arithmetically averaged, thereby obtaining the average primary particle diameter.

Here, in a case where the metal oxide particles agglomerate together, the measurement subject is not the agglomerated particle diameter of this agglomerate. The longest diameters of a predetermined number of particles (primary particles) of the metal oxide particles configuring this agglomerate are measured, and the average primary particle diameter is obtained.

The dispersion liquid may be used after the content of the metal oxide particles having a refractive index of 1.7 or more in the dispersion liquid according to the present embodiment is appropriately adjusted depending on a desired characteristic. From the viewpoint of satisfying both a light-scattering property and transparency, the content is preferably 1% by mass or more and 70% by mass or less, more preferably 5% by mass or more and 50% by mass or less, and still more preferably 5% by mass or more and 30% by mass or less.

The above description does not exclude the fact that the dispersion liquid includes metal oxide particles having a refractive index of less than 1.7. The dispersion liquid may include metal oxide particles having a refractive index of less than 1.7 in addition to the metal oxide particles having a refractive index of 1.7 or more depending on the purpose.

In addition, to the surfaces of the metal oxide particles described above, a surface-modifying material described below is attached. Therefore, the metal oxide particles are stably dispersed in the dispersion liquid.

(1.2 Surface-Modifying Material)

The dispersion liquid according to the present embodiment includes a surface-modifying material. This surface-modifying material is at least partially attached to the surfaces of the metal oxide particles in the dispersion liquid, thereby preventing the agglomeration of the metal oxide particles. Furthermore, the surface-modifying material improves the compatibility with a resin component described below.

Here, the surface-modifying material "being attached to" the metal oxide particles refers to the fact that the surface-modifying material comes in contact with or bonds to the metal oxide particles by an interaction therebetween. As the contact, for example, physical adsorption is exemplified. In addition, as the bonding, an ion bond, a hydrogen bond, a covalent bond, and the like are exemplified.

The surface-modifying material is not particularly limited as long as the surface-modifying material can be attached to the metal oxide particles and has a favorable compatibility between a dispersion medium and the resin component.

As the surface-modifying material, a surface-modifying material having a reactive functional group, for example, at least one functional group selected from the group of an alkenyl group, a H—Si group, and an alkoxy group is preferably used.

As the alkenyl group, for example, a linear or branched alkenyl group having 2 to 5 carbon atoms can be used, and, specifically, a 2-propenyl group, a prop-2-en-1-yl group, and the like are exemplified.

As the alkoxy group, for example, a linear or branched alkoxy group having 1 to 5 carbon atoms is exemplified, and, specifically, a methoxy group, an ethoxy group, an n-propoxy group, an isopropoxy group, a butoxy group, and the like are exemplified.

As the surface-modifying material having at least one functional group selected from the group of the alkenyl group, a H—Si group, and the alkoxy group, for example, a silane compound, a silicone compound, and a carbon-carbon unsaturated bond-containing fatty acid below are exemplified, and one compound of them can be singly used or two or more compounds can be used in combination.

As the silane compound, for example, one or more selected from the group consisting of vinyltrimethoxysilane, isobutyltrimethoxysilane, phenyltrimethoxysilane, methacryloxypropyltrimethoxysilane, acryloxypropyltrimethoxysilane, dimethylchlorosilane, methyldichlorosilane, diethylchlorosilane, ethyldichlorosilane, methylphenylchlorosilane, diphenylchlorosilane, phenyldichlorosilane, trimethoxysilane, dimethoxysilane, monomethoxysilane, triethoxysilane, diethoxymonomethylsilane, monoethoxydimethylsilane, methylphenyldimethoxysilane, diphenylmonomethoxysilane, methylphenyldiethoxysilane, and diphenylmonoethoxysilane is preferably used.

As the silicone compound, for example, one or more selected from the group consisting of methyl hydrogen silicone, dimethyl hydrogen silicone, methyl phenyl hydrogen silicone, phenyl hydrogen silicone, alkoxy both-terminal phenyl silicone, alkoxy group-containing phenyl silicone, alkoxy one-terminal vinyl one-terminal phenyl silicone, methyl phenyl silicone, alkoxy both-terminal methyl phenyl silicone, alkoxy one-terminal vinyl one-terminal methyl phenyl silicone, alkoxy group-containing dimethyl silicone, alkoxy group-containing methyl phenyl silicone, alkoxy one-terminal trimethyl one-terminal dimethyl silicone, and alkoxy one-terminal vinyl one-terminal dimethyl silicone is preferably used.

The silicone compound may be an oligomer or a resin (polymer).

As the carbon-carbon unsaturated bond-containing fatty acid, for example, a methacrylic acid, an acrylic acid, and the like are exemplified.

Among these surface-modifying materials, from the viewpoint of the suppression of the agglomeration of the metal oxide particles in the dispersion liquid or the composition and easiness in the obtainment of a highly transparent sealing member, one or more selected from the group of vinyltrimethoxysilane, isobutyltrimethoxysilane, phenyltrimethoxysilane, alkoxy one-terminal trimethyl one-terminal dimethyl silicone, and methyl phenyl silicone is preferably used.

From the viewpoint of the suppression of the agglomeration of the metal oxide particles in the dispersion liquid and greater easiness in the obtainment of a highly transparent sealing member, the surfaces are preferably modified with the silane compound and the silicone compound. That is, the dispersion liquid preferably includes at least one silane compound and at least one silicone compound. As a preferred silane compound, for example, vinyltrimethoxysilane, isobutyltrimethoxysilane, and phenyltrimethoxysilane are exemplified. As a preferred silicone compound, alkoxy one-terminal trimethyl one-terminal dimethyl silicone, methoxy group-containing phenyl silicone, and methylphenyl silicone are exemplified.

The content of the surface-modifying material in the dispersion liquid of the present embodiment is preferably 1% by mass or more and 80% by mass or less and more preferably 5% by mass or ore and 40% by mass or less with respect to the mass of the metal oxide particles.

As a method for attaching the surface-modifying material to the metal oxide particles, for example, a dry-type method in which the surface-modifying material is directly mixed with or sprayed to the metal oxide particles or a wet-type method in which the metal oxide particles are injected into water or an organic solvent in which the surface-modifying material is dissolved and the surfaces are modified in the solvent is exemplified.

In addition, from the viewpoint of suppressing the coloration of the dispersion liquid and improving the extraction efficiency of light, the content of the liberated surface-modifying material is preferably 53% by mass or less and more preferably 50% by mass or less with respect to the total content of the metal oxide particles and the surface-modifying material.

In the present specification, the "liberated surface-modifying material" refers to the surface-modifying material that is not attached to the metal oxide particles as described above. The content of the liberated surface-modifying material is, for example, a value calculated using the following method and is calculated on the basis of the mass of the surface-modifying material that can be extracted from the dispersion liquid using a good solvent of the surface-modifying material such as acetone.

Liquid in the dispersion liquid (5 g) is removed using an evaporator, thereby obtaining a concentrate. Next, acetone (2 g) is added to and mixed with this concentrate, thereby producing a liquid mixture.

An extraction liquid separated from the liquid mixture is collected by column chromatography in which a column filled with silica gel (10 g) and a developing solvent (hexane and acetone are mixed together in a volume ratio of 2:1) (100 cc) are used. Liquid in this extraction liquid is removed using the evaporator, and the mass of the obtained residue is measured with an assumption that the residue is the liberated surface-modifying material. The calculation result of the percentage of a value obtained by dividing the mass of this residue by the total mass of the metal oxide particles and the surface-modifying material included in the dispersion liquid (5 g) of the present embodiment is regarded to the content of the liberated surface-modifying material.

The content of the liberated surface-modifying material may be, for example, 0% by mass or more, 10% by mass or more, 20% by mass or more, or 30% by mass or more.

From the viewpoint of suppressing an increase in the viscosity of the composition described below, the content of the liberated surface-modifying material is preferably 20% by mass or more, more preferably 30% by mass or more, and still more preferably 35% by mass or more.

When the liberated surface-modifying material is present, in the composition described below, the liberated surface-modifying material remains even in a case where a dispersion medium is removed. It is assumed that, when a large amount of the liberated surface-modifying material is present in the composition, the amount of the metal oxide particles to which the surface-modifying material is attached becomes relatively small, and thus the viscosity of the composition can be suppressed.

(1.3 Dispersion Medium)

In addition, the dispersion liquid according to the present embodiment generally includes a dispersion medium that disperses the metal oxide particles. This dispersion medium is not particularly limited as long as the dispersion medium is capable of dispersing the metal oxide particles having a refractive index of 1.7 or more to which the surface-modifying material is attached and can be mixed with a resin component described below.

As the dispersion medium, for example, organic solvents such as alcohols, ketones, aromatic dispersion media, saturated hydrocarbons, and unsaturated hydrocarbons are exemplified. These solvents may be used singly or two or more solvents may be used.

From the viewpoint of the compatibility with a silicone resin described below, an organic solvent having an aromatic ring, that is, an aromatic dispersion medium is preferred, and an aromatic hydrocarbon, for example, toluene, xylene, benzene, or the like is particularly preferably used.

The content of the dispersion medium in the dispersion liquid of the present embodiment is preferably 10% by mass or more and 99% by mass or less, more preferably 10% by mass or more and 80% by mass or less, and still more preferably 10% by mass or more and 70% by mass or less.

In addition, the dispersion liquid according to the present embodiment may also include, as necessary, components other than the above-described components, for example, ordinary additives such as a dispersant, a dispersion aid, an antioxidant, a flow adjuster, a viscosity improver, a pH adjuster, and a preservative.

In the present specification, the dispersion liquid according to the present embodiment is differentiated from a composition according to the present embodiment which includes a resin component and is capable of forming a sealing member by being cured. That is, the dispersion liquid according to the present embodiment does not include a resin component described below as much as the dispersion liquid is capable of forming the sealing member by simply being cured. More specifically, the mass ratio between the resin component and the metal oxide particles in the dispersion liquid according to the present embodiment is preferably in a range of 0:100 to 40:60 and more preferably in a range of 0:100 to 20:80 (resin component:metal oxide particles). The dispersion liquid according to the present embodiment still more preferably does not essentially include the resin component described below and particularly preferably does not include the resin component described below at all.

According to the present embodiment described above, in the dispersion liquid, D50 of the metal oxide particles is 30 nm or more and 100 nm or less, and D50/D90 is 0.20 or more, and thus the balance between the light-scattering property and the transparency is excellent. Therefore, in a case where a composition described below is used for the sealing material, the extraction efficiency of light can be improved.

<2. Method for Producing Dispersion Liquid>

Next, a method for producing the dispersion liquid according to the present embodiment will be described. The dispersion liquid can be produced by, for example, mixing the respective components of the dispersion liquid and then dispersing the components by controlling the power or the like of a well-known disperser using the disperser. Here, for the dispersion liquid according to the present embodiment, the components are preferably dispersed by imparting the minimum necessary amount of energy without imparting excess energy so that the particle diameters of the metal oxide particles become almost uniform in the dispersion liquid.

As the well-known disperser, for example, a bead mill, a ball mill, a homogenizer, a disperser, a stirrer, or the like is preferably used.

Here, a method for producing the dispersion liquid using a bead mill will be described in detail.

In the case of producing the dispersion liquid of the present embodiment using a bead mill, the components may be dispersed under a condition in which the power displayed on a bead mill device during a dispersion treatment reaches 1.0 kW to 2.5 kW per kilogram of the dispersion liquid by setting the blade circumferential velocity in a dispersion container to 4 m/s or more and 9 m/s or less and setting the cooling water temperature to 10° C. or higher and 30° C. or lower.

When the components are dispersed under conditions as described above, it is possible to set D50 to 30 nm or more and 100 nm or less, set D50/D90 to 0.20 or more, and control the content of the liberated surface-modifying material to be 53% by mass or less.

The dispersion liquid of the present embodiment can be obtained using the above-described method.

<3. Composition>

Next, a composition according to the present embodiment will be described. The composition according to the present embodiment is obtained by mixing the above-described dispersion liquid and a resin component and includes, in addition to the above-described metal oxide particles having a refractive index of 1.7 or more and the surface-modifying material at least partially attached to the metal oxide particles, a resin component, that is, a resin and/or a precursor thereof.

The composition according to the present embodiment is cured as described below and used as a sealing member for a light-emitting element. The composition according to the present embodiment includes the above-described metal oxide particles contributing to the improvement of the light-scattering property and transparency and is thus capable of improving the extraction efficiency of light when being used for a sealing member.

From the viewpoint of obtaining a highly transparent composition, the content of the metal oxide particles having a refractive index of 1.7 or more in the composition according to the present embodiment is preferably 5% by mass or more and 50% by mass or less, more preferably 5% by mass or more and 40% by mass or less, and still more preferably 10% by mass or more and 35% by mass or less.

In addition, the content of the surface-modifying material and the content of the liberated surface-modifying material can be set to be identical to the contents in the dispersion liquid according to the present embodiment.

The resin component is a main component in the composition according to the present embodiment. The resin component prevents a deterioration factor from the external environment such as moisture or oxygen from reaching a light-emitting element by being cured to seal the light-emitting element when the composition according to the present embodiment is used as a sealing material. In addition, in the present embodiment, a cured substance obtained from the resin component is basically transparent and is capable of transmitting light emitted from the light-emitting element.

The resin component is not particularly limited as long as the resin component can be used as a sealing material, and it is possible to use, for example, a silicone resin, an epoxy resin, or the like. Particularly, a silicone resin is preferred.

The silicone resin is not particularly limited as long as the silicone resin is used as a sealing material, and it is possible to use, for example, a dimethyl silicone resin, a methyl phenyl silicone resin, a phenyl silicone resin, an organically modified silicone resin, or the like.

Particularly, in a case where a surface-modifying material having at least one functional group selected from an alkenyl group, an H—Si group, and an alkoxy group is used as the surface-modifying material, a silicone resin having at least one functional group selected from a H—Si group, an alkenyl group, and an alkoxy group is preferably used as the silicone resin. The reason therefor will be described below.

The alkenyl group in the surface-modifying material reacts with the H—Si group in the silicone resin to form a crosslink. The H—Si group in the surface-modifying material reacts with the alkenyl group in the silicone resin to form a crosslink. The alkoxy group in the surface-modifying material condenses with the alkoxy group in the silicone resin through hydrolysis. The silicone resin and the surface-modifying material are integrated with each other by the above-described bond, and thus it is possible to improve the strength or denseness of a sealing member to be obtained.

The structure of the resin component may be a two-dimensional chain-like structure, a three-dimensional net-like structure, or a basket-like structure.

The resin component needs to be in a cured polymer form when used as a sealing member and may be in a to-be-cured state, that is, a precursor in the composition. Therefore, the resin component present in the composition may be a monomer, an oligomer, or a polymer.

As the resin component, an addition reaction-type resin may be used, a condensation reaction-type resin may be used, or a radical polymerization reaction-type resin may be used.

The viscosity of the resin component at 25° C., which is measured according to JIS Z8803:2011, is, for example, 10 mPa·s or more and 100,000 mPa·s or less, preferably 100 mPa·s or more and 10,000 mPa·s or less, and more preferably 1,000 mPa·s or more and 7,000 mPa·s or less.

In addition, the content of the resin component in the composition according to the present embodiment can be set to be a remainder of the other components and is, for example, 10% by mass or more and 70% by mass or less.

The mass ratio between the resin component in the composition according to the present embodiment and the metal oxide particles is preferably in a range of 50:50 to 90:10 and more preferably in a range of 60:40 to 80:20 (resin component:metal oxide particle).

The dispersion medium derived from the dispersion liquid according to the present embodiment may be included in or removed from the composition according to the present embodiment. That is, the dispersion medium derived from the dispersion liquid may be fully removed or may be left in the composition in an amount of approximately 1% by mass or more and 10% by mass or less or approximately 2% by mass or more and 5% by mass or less with respect to the mass of the composition.

In addition, the composition according to the present embodiment may include the particles of a fluorescent body as long as the object of the present invention is not impaired. The particles of a fluorescent body absorb light having a specific wavelength emitted from the light-emitting element and release light having a predetermined wavelength. That is, it becomes possible to convert the wavelength of light using the particles of a fluorescent body and, furthermore, adjust the color tone.

The particles of a fluorescent body are not particularly limited as long as the particles can be used a light-emitting device as described below and can be appropriately selected and used so that the color of light emitted from the light-emitting device becomes a desired color.

The content of the particles of a fluorescent body in the composition according to the present embodiment can be appropriately adjusted so as to obtain a desired brightness.

In addition, the composition according to the present embodiment may also contain an additive that is generally used such as a preservative, a polymerization initiator, a polymerization inhibitor, a curing catalyst, or a light scattering agent as long as the object of the present invention is not impaired. As the light scattering agent, silica particles having an average particle diameter of 1 to 30 μm are preferably used.

The viscosity of the above-described composition according to the present embodiment is, for example, 0.1 Pa·s or more and 100 Pa·s or less, preferably 0.5 Pa·s or more and 50 Pa·s or less, and more preferably 1.0 Pa·s or more and 20 Pa·s or less under conditions of a measurement temperature of 25° C. and a shear rate of 1.0 (1/s). When the viscosity of the composition is in the above-described range, the handling of the composition becomes easy at the time of sealing a light-emitting element, and it becomes easy to impart the composition to a recess portion of a substrate that supports the light-emitting element. In addition, it becomes possible to form a sealing member having a protrusion shape or a flat surface shape while preventing the infusion of an air bubble into the sealing member at the time of sealing the light-emitting element.

The composition according to the present embodiment can be produced by mixing the dispersion liquid according to the present embodiment and the resin component. In addition, after the mixing, the dispersion medium contained in the dispersion liquid may be removed using an evaporator or the like as necessary.

The composition according to the present embodiment includes the metal oxide particles having a refractive index of 1.7 or more to which a surface-modifying material is attached and which have predetermined D50 and D50/D90 in the above-described dispersion liquid and the resin component, and thus the balance between the light-scattering property and the transparency is excellent. Therefore, it is possible to form a sealing member having an excellent extraction efficient of light.

<4. Sealing Member>

A sealing member according to the present embodiment is a cured substance of the composition according to the present embodiment. The sealing member according to the present embodiment is generally used as a sealing member that is disposed on a light-emitting element or a part thereof.

The thickness or shape of the sealing member according to the present embodiment can be appropriately adjusted depending on a desired use or characteristic and is not particularly limited.

The sealing member according to the present embodiment can be produced by curing the composition according to the present embodiment as described above. A method for curing the composition can be selected depending on the characteristic of the resin component in the composition according to the present embodiment, and, for example, thermal curing, electron beam curing, and the like are exemplified. More specifically, the sealing member according to the present embodiment can be obtained by curing the resin component in the composition according to the present embodiment by an addition reaction or a polymerization reaction.

The average dispersed-particle diameter of the metal oxide particles in the sealing member is preferably 40 nm or more and 200 nm or less, more preferably 40 nm or more and 150 nm or less, and still more preferably 45 nm or more and 130 nm or less.

In a case where the average dispersed-particle diameter is 40 nm or more, it is possible to sufficiently obtain a light-scattering effect and to further improve the extraction efficiency of light of a light-emitting device. On the other hand, in a case where the average dispersed-particle diameter is 200 nm or less, it is possible to appropriately increase the transmittance of the sealing member and to further improve the extraction efficiency of light of a light-emitting device.

The average dispersed-particle diameter of the metal oxide particles in the sealing member is a number distribution-based average particle diameter (median diameter) which is measured by the transmission electron microscopic observation (TEM) of the sealing member. In addition, the average dispersed-particle diameter of the metal oxide particles in the sealing member in the present embodiment is a value that is measured and calculated on the basis of the dispersed-particle diameters of the metal oxide particles in the sealing member. The average dispersed-particle diameter is measured and calculated on the basis of the diameters of the metal oxide particles in a dispersed state regardless of whether the dispersed metal oxide particles are in a primary particle or secondary particle state. In addition, in the present embodiment, the average particle diameter of the metal oxide particles in the sealing member may be measured as the average particle diameter of the metal oxide particles to which the surface-modifying material described below is attached. In the sealing member, the metal oxide particles to which the surface-modifying material is attached and the metal oxide particles to which the surface-modifying material is not attached may be present, and thus, generally, the average particle diameter of the metal oxide particles in the sealing member is measured as a value in a state both kinds of the metal oxide particles are mixed together.

In addition, an effect of the sealing member for improving the extraction efficiency of light cannot be obtained by simply setting the average dispersed-particle diameter of the metal oxide particles in the sealing member as described above. The effect of the sealing member for improving the extraction efficiency of light can be obtained by forming the sealing member using the dispersion liquid according to the present embodiment.

The sealing member according to the present embodiment is a cured substance of the composition according to the present embodiment and is thus excellent in terms of the balance between the light-scattering property and transparency. Therefore, according to the present embodiment, it is possible to obtain a sealing member having an excellent extraction efficiency of light.

<5. Light-Emitting Device>

Next, a light-emitting device according to the present embodiment will be described. The light-emitting device according to the present embodiment includes the above-described sealing member and a light-emitting element sealed with the sealing member.

As the light-emitting element, for example, a light-emitting diode (LED), an organic light-emitting diode (OLED), or the like is exemplified. Particularly, the sealing member according to the present embodiment is suitable for the sealing of a light-emitting diode.

Hereinafter, the light-emitting device according to the present embodiment will be described using an example in which the light-emitting element is a light-emitting diode on a chip, that is, an LED chip, and the light-emitting device is an LED package. FIGS. 1 to 4 each are schematic views (cross-sectional views) showing examples of the light-emitting device according to the present embodiment. The sizes of individual members in the drawings are appropriately stressed in order to facilitate the description and do not indicate actual dimensions and ratios between the members. In the present specification and the drawings, configurational elements having substantially the same functional configuration will be given the same reference sign and will not be described again.

A light-emitting device (LED package) 1A shown in FIG. 1 includes a substrate 2 having a recess portion 21, a light-emitting element (LED chip) 3 that is disposed on a bottom surface of the recess portion 21 of the substrate 2, and a sealing member 4A that seals and covers the light-emitting element 3 in the recess portion 21.

The sealing member 4A is configured using the above-described sealing member according to the present embodiment. Therefore, in the sealing member 4A, the above-described metal oxide particle derived from the composition according to the present embodiment are dispersed, and, consequently, the extraction efficiency of light in the light-emitting device 1A improves. In addition, in the sealing member 4A, particles of a fluorescent body 5 are dispersed. The particles of a fluorescent body 5 convert the wavelength of at least a part of light released from the light-emitting element 3.

Figure 2:
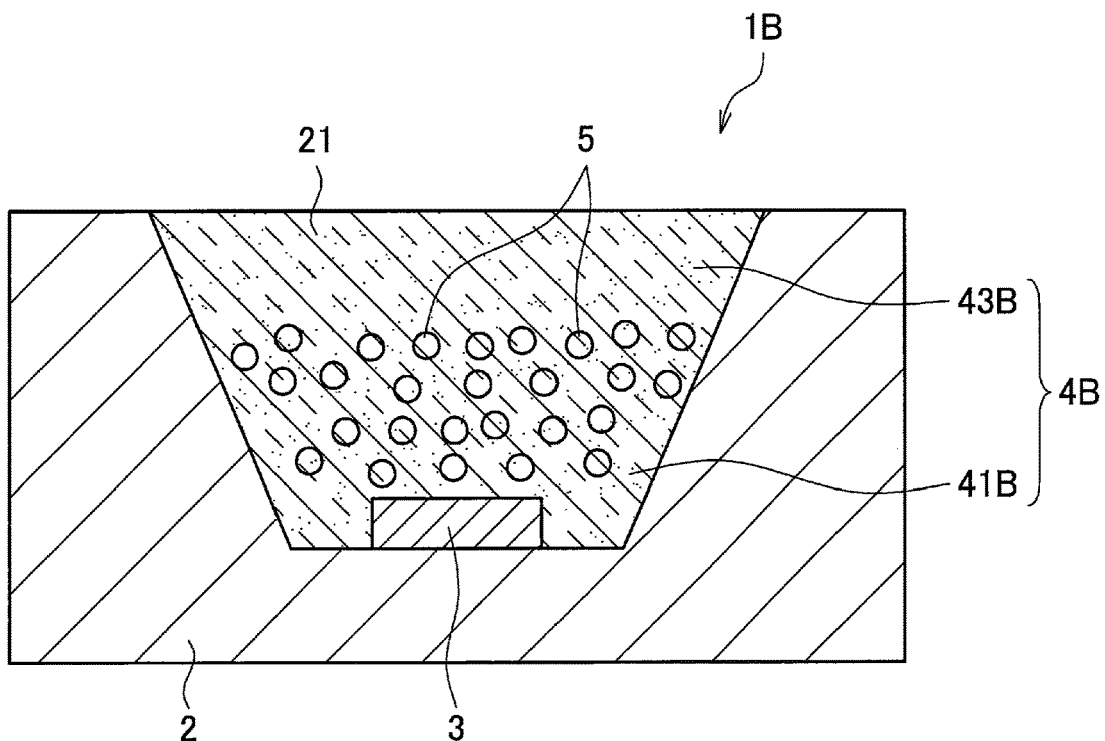
FIG. 2 is a schematic view showing another example of the light-emitting device according to the embodiment of the present invention.

A light-emitting device 1B shown in FIG. 2 is different from the light-emitting device 1A in terms of the fact that a sealing member 4B forms two layers. That is, the sealing member 4B has a first layer 41B that directly covers the light-emitting element 3 and a second layer 43B that coves the first layer 41B. The first layer 41B and the second layer 43B are both the sealing member according to the present embodiment. In the first layer 41B, the particles of a fluorescent body 5 are dispersed. On the other hand, the second layer 43B does not include the particles of a fluorescent body 5. In the light-emitting device 1B, the above-described metal oxide particle derived from the composition according to the present embodiment are dispersed in the first layer 41B and the second layer 43B configuring the sealing member 4B, and thus the extraction efficiency of light improves.

Figure 3:
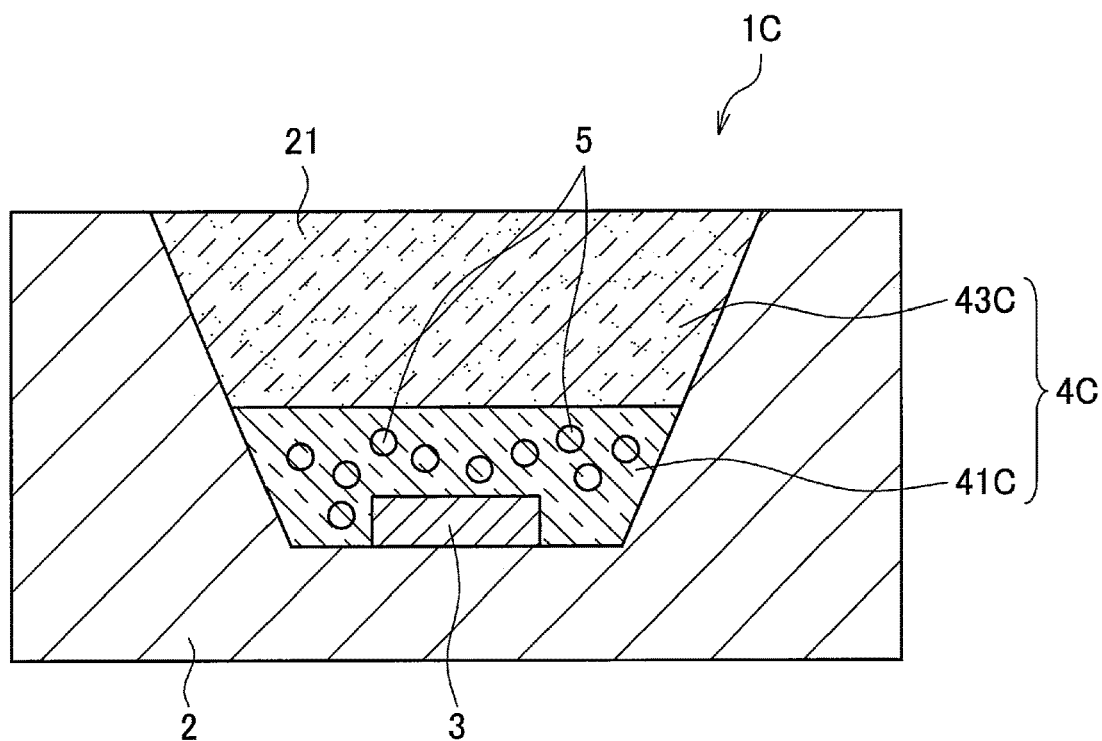
FIG. 3 is a schematic view showing still another example of the light-emitting device according to the embodiment of the present invention.

A light-emitting device 1C shown in FIG. 3 is also different from the light-emitting device 1A in terms of the fact that the configuration of a sealing member 4C is different from that of the sealing member 4A. The sealing member 4C has a first layer 41C that directly covers the light-emitting element 3 and a second layer 43C that coves the first layer 41C. The first layer 41C is not the sealing member according to the present embodiment, is a sealing member of a resin not including the above-described metal oxide particles, and is configured using a resin or the like that can be used for a sealing member. In addition, in the first layer 41C, the particles of a fluorescent body 5 are dispersed. On the other hand, the second layer 43C is the sealing member according to the present embodiment. In the light-emitting device 1C, the above-described metal oxide particles derived from the composition according to the present embodiment are dispersed in the second layer 43C configuring the sealing member 4C, and thus the extraction efficiency of light improves.

Figure 4:
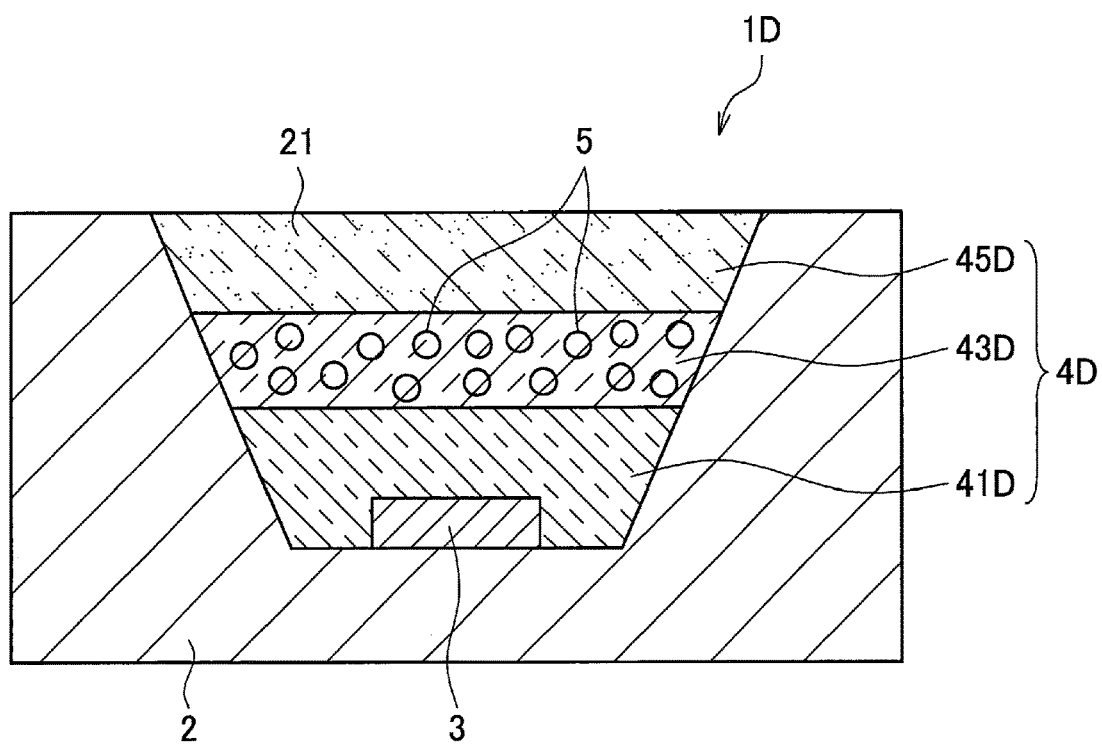
FIG. 4 is a schematic view showing far still another example of the light-emitting device according to the embodiment of the present invention.

In a light-emitting device 1D shown in FIG. 4, a sealing member 4D has a first layer 41D that directly covers the light-emitting element 3, a second layer 43D that coves the first layer 41D, and a third layer 45D that further covers the second layer 43D. The first layer 41D are the second layer 43D are not the sealing member according to the present embodiment, are a sealing member of a resin not including the above-described metal oxide particles, and are configured using a resin or the like that can be used for a sealing member. In addition, in the second layer 43D, the particles of a fluorescent body 5 are dispersed. On the other hand, the third layer 45D is the sealing member according to the present embodiment. In the light-emitting device 1D, the above-described metal oxide particles derived from the composition according to the present embodiment are dispersed in the third layer 45D configuring the sealing member 4D, and thus the extraction efficiency of light improves.

The light-emitting device according to the present embodiment is not limited to the aspects shown in the drawings. For example, the light-emitting device according to the present embodiment may not include the particles of a fluorescent body in the sealing member. In addition, the sealing member according to the present embodiment can be present in an arbitrary location in the light-emitting device.

In the light-emitting device according to the present embodiment, the light-emitting element is sealed with the sealing member according to the present embodiment, and thus the extraction efficiency of light is excellent.

In the light-emitting device according to the present embodiment, the light-emitting element is sealed with the above-described composition according to the present embodiment. Therefore, the present invention, in a sense, also relates to a method for producing a light-emitting device having a step of sealing a light-emitting element using the composition according to the present embodiment. In the same sense, the production method may also have a step of obtaining the composition by mixing the dispersion liquid according to the present embodiment and the resin component.

The light-emitting element is sealed by, for example, imparting the composition according to the present embodiment onto the light-emitting element using a dispenser or the like and then curing the composition.

The above-described light-emitting device according to the present embodiment can be used in, for example, an illumination tool and a display device. Therefore, the present invention, in a sense, relates to an illumination tool or a display device including the light-emitting device according to the present embodiment.

As the illumination tool, for example, an ordinary illumination tool such as an indoor lamp or an outdoor lamp, an illumination in a switch portion of an electronic device such as a mobile phone or OA equipment, and the like are exemplified.

The illumination tool according to the present embodiment includes the light-emitting device according to the present embodiment, and thus the luminous flux being emitted becomes large compared with that in the related art even when the same light-emitting element is used, and it is possible to make the ambient environment brighter.

As the display device, for example, a mobile phone, a mobile information terminal, an electronic dictionary, a digital camera, a computer, a television, a peripheral device thereof, and the like are exemplified.

The display device according to the present embodiment includes the light-emitting device according to the present embodiment, and thus the luminous flux being emitted becomes large compared with that in the related art even when the same light-emitting element is used, and it is possible to carry out displaying, for example, in a clearer and brighter manner.

EXAMPLES

Hereinafter, the present invention will be described in more detail using examples. The examples described below are simply examples of the present invention and do not limit the present invention.

Example 1

(Production of Dispersion Liquid)

Zirconium oxide particles having an average primary particle diameter of 5 nm (manufactured by Sumitomo Osaka Cement Co., Ltd.) (10 g), toluene (82 g), and, as a surface-modifying material, a methoxy group-containing phenyl silicone resin (manufactured by Shin-Etsu Chemical Co., Ltd., KR217) (5 g) were added and mixed together. A dispersion treatment is carried out on this liquid mixture for six hours using a bead mill by setting a blade circumferential velocity to 5.0 m/s and the cooling water temperature to 25° C., thereby obtaining a dispersion liquid according to Example 1. The power per unit mass obtained by dividing the power displayed on a bead mill device during the dispersion treatment by the amount of a slurry prepared was 1.4 kW/kg.

(Evaluation of Particle Diameter)

A part of the obtained dispersion liquid was sampled and diluted with toluene so that the solid content reached 5% by mass. D50 and D90 of this diluted dispersion liquid were measured using a particle size distribution meter (manufactured by Horiba, Ltd., model No.: SZ-100SP). As a result, D50 was 32 nm, and D50/D90 was 0.25. The result is shown in Table 1. Particles included in the dispersion liquid were basically zirconium oxide particles to which the surface-modifying material was attached alone, and thus the measured D50 and D90 were considered to be D50 and D90 of the zirconium oxide particles.

(Evaluation of content of liberated surface-modifying material)

Liquid in the obtained dispersion liquid (5 g) (the total content of the zirconium oxide particles and the surface-modifying material was 0.78 g) was removed using an evaporator.

Acetone (2 g) was added to and mixed with this concentrate, thereby producing a liquid mixture.

An extraction liquid separated from the liquid mixture was collected by column chromatography in which a column filled with silica gel (10 g) and a developing solvent (hexane and acetone were mixed together in a volume ratio of 2:1) (100 cc) were used. Liquid in this extraction liquid was removed using the evaporator, the obtained residue was regarded as a liberated surface-modifying material, and the mass thereof was measured. The percentage of a value obtained by dividing the mass of this residue by the total mass (0.78 g) of the zirconium oxide particles and the surface-modifying material included in the dispersion liquid (5 g) was calculated.

As a result, the content of the liberated surface-modifying material was 40% by mass. The result is shown in Table 1.

(Production of composition)

The obtained dispersion liquid (10 g) according to Example 1 and a methyl phenyl silicone resin (OE-6520 manufactured by Dow Corning Toray Co., Ltd., refractive index: 1.54, mass blend ratio between A liquid and B liquid=1:1 (a reaction catalyst was contained in the resin)) (7.6 g) as a silicone resin were mixed together. Next, this liquid mixture was dried at a reduced pressure to remove toluene, thereby obtaining a composition according to Example 1 containing surface-modified zirconium oxide particles and the methyl phenyl silicone resin (OE-6520). The contents of the zirconium oxide particles and toluene in a composition were respectively 11% by mass and 2% by mass.

(Evaluation of Transmittance of Composition)

The transmittance of the obtained composition according to Example 1 was measured using an integrating sphere in a UV-visible/NIR spectrophotometer V-770 (manufactured by JASCO Corporation). As a measurement sample, a sample having a thickness (light path length) of 1 mm obtained by sandwiching the composition between thin layer silica cells was used.

As a result, the transmission of the composition at a wavelength of 460 nm was 84%, and the transmission of the composition at a wavelength of 600 nm was 90%. The result is shown in Table 1.

(Evaluation of Viscosity of Composition)

The viscosity of the obtained composition according to Example 1 was measured using a rheometer (RHEO-STRESS RS-6000, manufactured by HAAKE). The viscosity was measured at a temperature of 25° C. by setting the shear rate to 1.0 (1/s).

As a result, the viscosity of the composition according to Example 1 was 10 Pa·s.

(Production of Sealing Member)

A groove having a length of 20 mm, a width of 15 mm, and a depth of 5 mm was provided in an SUS substrate, thereby producing a mold having the groove coated with fluorine. The obtained composition was caused to flow into the groove of the mold so that the thickness of the cured composition reached 0.5 mm, cured by a heating treatment at 150° C. for four hours, and removed from the SUS substrate, thereby obtaining a sealing member according to Example 1.

(Evaluation of Transmittance of Sealing Member)

The transmittance of the obtained sealing member was measured using an integrating sphere in the spectrophotometer V-770 (manufactured by JASCO Corporation).

As a result, the transmission of the sealing member at a wavelength of 460 nm was 25%, and the transmission of the composition at a wavelength of 600 nm was 70%. The result is shown in Table 1.

(Average Dispersed-Particle Diameter of Metal Oxide Particles in Sealing Member)

A piece obtained by slicing the sealing member in the thickness direction was used as a specimen, and the average dispersed-particle diameter of zirconium oxide particles in the sealing member was measured using a field emission transmission electron microscope (JEM-2100F, manufactured by JEOL Ltd.). As a result, the average dispersed-particle diameter of the metal oxide particles in the sealing member was 55 nm. The result is shown in Table 1.

(Production of LED Package and Evaluation of Total Luminous Flux)

A blue light-emitting diode (LED chip) was sealed with the composition according to Example 1 using a capacity measuring digital control dispenser (trade name: MEASURING MASTER MPP-1, manufactured by Musashi Engineering, Inc.). The composition was cured by a heating treatment at 150° C. for two hours, thereby producing a 3030 series (3.0 mm×3.0 mm) LED package (light-emitting device) according to Example 1.

The total luminous flux of this LED package was measured using a total luminous flux measurement system HM series (manufactured by Otsuka Electronics Co., Ltd., sphere size: 3,000 mm).

As a result, the total luminous flux of the LED package according to Example 1 was 61.2 lm.

Example 2

A dispersion liquid according to Example 2 was obtained in the very same manner as in Example 1 except for the fact that zirconium oxide particles having an average primary particle diameter of 10 nm were used, the blade circumferential velocity was set to 6.0 m/s, and the cooling water temperature was set to 20° C. The power per unit mass obtained by dividing the power displayed on the bead mill device during the dispersion treatment by the amount of a slurry prepared was 2.3 kW/kg.

The particle diameters and the content of the liberated surface-modifying material were measured in the same manner as in Example 1. As a result, D50 was 48 nm, D50/D90 was 0.56. In addition, the content of the liberated surface-modifying material was 45% by mass. The results are shown in Table 1.

A composition, a sealing member, and an LED package according to Example 2 were obtained in the same manner as in Example 1 except for the fact that the dispersion liquid according to Example 2 was used instead of the dispersion liquid according to Example 1.

As a result of measuring the transmittance of the composition in the same manner as in Example 1, the transmittance at a wavelength of 460 nm was 58%, and the transmittance at a wavelength of 600 nm was 79%.

As a result of measuring the viscosity of the composition in the same manner as in Example 1, the viscosity of the composition according to Example 2 was 7 Pa·s.

As a result of measuring the transmittance of the sealing member in the same manner as in Example 1, the transmittance at a wavelength of 460 nm was 15%, and the transmittance at a wavelength of 600 nm was 52%.

In addition, as a result of measuring the average dispersed-particle diameter of the metal oxide particles in the sealing member according to Example 2 in the same manner as in Example 1, the average dispersed-particle diameter was 85 nm.

In addition, as a result of measuring the total luminous flux in the same manner as in Example 1 regarding the LED package according to Example 2, the total luminous flux was 61.3 lm. The result is shown in Table 1.

Example 3

A dispersion liquid according to Example 3 was obtained in the very same manner as in Example 1 except for the fact that zirconium oxide particles having an average primary particle diameter of 20 nm were used, the blade circumferential velocity was set to 6.0 m/s, and the cooling water temperature was set to 15° C. The power per unit mass obtained by dividing the power displayed on the bead mill device during the dispersion treatment by the amount of a slurry prepared was 2.2 kW/kg.

The particle diameters and the content of the liberated surface-modifying material were measured in the same manner as in Example 1. As a result, D50 was 57 nm, and D50/D90 was 0.60. In addition, the content of the liberated surface-modifying material was 50% by mass. The results are shown in Table 1.

A composition, a sealing member, and an LED package according to Example 3 were obtained in the same manner as in Example 1 except for the fact that the dispersion liquid according to Example 3 was used instead of the dispersion liquid according to Example 1.

As a result of measuring the transmittance of the composition in the same manner as in Example 1, the transmittance at a wavelength of 460 nm was 41%, and the transmittance at a wavelength of 600 nm was 68%.

As a result of measuring the viscosity of the composition in the same manner as in Example 1, the viscosity of the composition according to Example 3 was 4 Pa·s.

As a result of measuring the transmittance of the sealing member in the same manner as in Example 1, the transmittance at a wavelength of 460 nm was 10%, and the transmittance at a wavelength of 600 nm was 41%.

In addition, as a result of measuring the average dispersed-particle diameter of the metal oxide particles in the sealing member according to Example 3 in the same manner as in Example 1, the average dispersed-particle diameter was 128 nm.

In addition, as a result of measuring the total luminous flux in the same manner as in Example 1 regarding the LED package according to Example 3, the total luminous flux was 61.7 lm. The result is shown in Table 1.

Example 4

A dispersion liquid according to Example 4 was obtained in the very same manner as in Example 1 except for the fact that titanium oxide particles having an average primary particle diameter of 15 nm were used, the blade circumferential velocity was set to 6.0 m/s, and the cooling water temperature was set to 15° C. The power per unit mass obtained by dividing the power displayed on the bead mill device during the dispersion treatment by the amount of a slurry prepared was 2.1 kW/kg.

The particle diameters and the content of the liberated surface-modifying material were measured in the same manner as in Example 1. As a result, D50 was 51 nm, and D50/D90 was 0.40. In addition, the content of the liberated surface-modifying material was 42% by mass. The results are shown in Table 1.

A composition, a sealing member, and an LED package according to Example 4 were obtained in the same manner as in Example 1 except for the fact that the dispersion liquid according to Example 4 was used instead of the dispersion liquid according to Example 1.

As a result of measuring the transmittance of the composition in the same manner as in Example 1, the transmittance at a wavelength of 460 nm was 38%, and the transmittance at a wavelength of 600 nm was 61%.

As a result of measuring the viscosity of the composition in the same manner as in Example 1, the viscosity of the composition according to Example 4 was 9 Pa·s.

As a result of measuring the transmittance of the sealing member in the same manner as in Example 1, the transmittance at a wavelength of 460 nm was 19%, and the transmittance at a wavelength of 600 nm was 35%.

In addition, as a result of measuring the average dispersed-particle diameter of the metal oxide particles in the sealing member according to Example 4 in the same manner as in Example 1, the average dispersed-particle diameter was 110 nm.

In addition, as a result of measuring the total luminous flux in the same manner as in Example 1 regarding the LED package according to Example 4, the total luminous flux was 61.4 lm. The result is shown in Table 1.

Example 5

A dispersion liquid according to Example 5 was obtained in the same manner as in Example 1 except for the fact that zirconium oxide particles having an average primary particle diameter of 12 nm were used, the amount of the methoxy group-containing phenyl silicone resin used was changed to 3 g from 5 g, and the cooling water temperature was set to 20° C. The power per unit mass obtained by dividing the power displayed on the bead mill device during the dispersion treatment by the amount of a slurry prepared was 1.6 kW/kg.

The particle diameters and the content of the liberated surface-modifying material were measured in the same manner as in Example 1. As a result, D50 was 51 nm, and D50/D90 was 0.58. In addition, the content of the liberated surface-modifying material was 15% by mass. The results are shown in Table 1.

A composition, a sealing member, and an LED package according to Example 5 were obtained in the same manner as in Example 1 except for the fact that the dispersion liquid according to Example 5 was used instead of the dispersion liquid according to Example 1.

As a result of measuring the transmittance of the composition in the same manner as in Example 1, the transmittance at a wavelength of 460 nm was 54%, and the transmittance at a wavelength of 600 nm was 73%.

As a result of measuring the viscosity of the composition in the same manner as in Example 1, the viscosity of the composition according to Example 5 was 175 Pa·s.

As a result of measuring the transmittance of the sealing member in the same manner as in Example 1, the transmittance at a wavelength of 460 nm was 13%, and the transmittance at a wavelength of 600 nm was 45%.

In addition, as a result of measuring the average dispersed-particle diameter of the metal oxide particles in the sealing member according to Example 5 in the same manner as in Example 1, the average dispersed-particle diameter was 98 nm.

In addition, as a result of measuring the total luminous flux in the same manner as in Example 1 regarding the LED package according to Example 5, the total luminous flux was 61.3 lm. The result is shown in Table 1.

Comparative Example 1

A dispersion liquid according to Comparative Example 1 was obtained in the very same manner as in Example 1 except for the fact that zirconium oxide particles having an average primary particle diameter of 8 nm were used, the blade circumferential velocity was set to 10.0 m/s, and the cooling water temperature was set to 20° C. The power per unit mass obtained by dividing the power displayed on the bead mill device during the dispersion treatment by the amount of a slurry prepared was 8.5 kW/kg.

The particle diameters and the content of the liberated surface-modifying material were measured in the same manner as in Example 1. As a result, D50 was 22 nm, and D50/D90 was 0.18. In addition, the content of the liberated surface-modifying material was 61% by mass. The results are shown in Table 1.

A composition, a sealing member, and an LED package according to Comparative Example 1 were obtained in the same manner as in Example 1 except for the fact that the dispersion liquid according to Comparative Example 1 was used instead of the dispersion liquid according to Example 1.

As a result of measuring the transmittance of the composition in the same manner as in Example 1, the transmittance at a wavelength of 460 nm was 75%, and the transmittance at a wavelength of 600 nm was 85%.

As a result of measuring the viscosity of the composition in the same manner as in Example 1, the viscosity of the composition according to Comparative Example 1 was 30 Pa·s.

As a result of measuring the transmittance of the sealing member in the same manner as in Example 1, the transmittance at a wavelength of 460 nm was 38%, and the transmittance at a wavelength of 600 nm was 81%.

In addition, as a result of measuring the average dispersed-particle diameter of the metal oxide particles in the sealing member according to Comparative Example 1 in the same manner as in Example 1, the average dispersed-particle diameter was 28 nm.

In addition, as a result of measuring the total luminous flux in the same manner as in Example 1 regarding the LED package according to Comparative Example 1, the total luminous flux was 60.0 lm. The result is shown in Table 1.

Comparative Example 2

A dispersion liquid according to Comparative Example 2 was obtained in the very same manner as in Example 1 except for the fact that zirconium oxide particles having an average primary particle diameter of 33 nm were used, the blade circumferential velocity was set to 12.0 m/s, and the cooling water temperature was set to 40° C. The power per unit mass obtained by dividing the power displayed on the bead mill device during the dispersion treatment by the amount of a slurry prepared was 12.9 kW/kg.

The particle diameters and the content of the liberated surface-modifying material were measured in the same manner as in Example 1. As a result, D50 was 125 nm, and D50/D90 was 0.15. In addition, the content of the liberated surface-modifying material was 65% by mass. The results are shown in Table 1.

A composition, a sealing member, and an LED package according to Comparative Example 2 were obtained in the same manner as in Example 1 except for the fact that the dispersion liquid according to Comparative Example 2 was used instead of the dispersion liquid according to Example 1.

As a result of measuring the transmittance of the composition in the same manner as in Example 1, the transmittance at a wavelength of 460 nm was 18%, and the transmittance at a wavelength of 600 nm was 29%.

As a result of measuring the viscosity of the composition in the same manner as in Example 1, the viscosity of the composition according to Comparative Example 2 was 51 Pa·s.

As a result of measuring the transmittance of the sealing member in the same manner as in Example 1, the transmittance at a wavelength of 460 nm was 3%, and the transmittance at a wavelength of 600 nm was 21%.

In addition, as a result of measuring the average dispersed-particle diameter of the metal oxide particles in the sealing member according to Comparative Example 2 in the same manner as in Example 1, the average dispersed-particle diameter was 160 nm.

In addition, as a result of measuring the total luminous flux in the same manner as in Example 1 regarding the LED package according to Comparative Example 2, the total luminous flux was 59.7 lm. The result is shown in Table 1.

Comparative Example 3

A dispersion liquid according to Comparative Example 3 was obtained in the very same manner as in Example 1 except for the fact that zirconium oxide particles having an average primary particle diameter of 18 nm were used, the blade circumferential velocity was set to 6.0 m/s, and the cooling water temperature was set to 40° C. The power per unit mass obtained by dividing the power displayed on the bead mill device during the dispersion treatment by the amount of a slurry prepared was 4.7 kW/kg.

The particle diameters and the content of the liberated surface-modifying material were measured in the same manner as in Example 1. As a result, D50 was 42 nm, and D50/D90 was 0.18. In addition, the content of the liberated surface-modifying material was 58% by mass. The results are shown in Table 1.

A composition, a sealing member, and an LED package according to Comparative Example 3 were obtained in the same manner as in Example 1 except for the fact that the dispersion liquid according to Comparative Example 1 was used instead of the dispersion liquid according to Example 3.

As a result of measuring the transmittance of the composition in the same manner as in Example 1, the transmittance at a wavelength of 460 nm was 25%, and the transmittance at a wavelength of 600 nm was 37%.

As a result of measuring the viscosity of the composition in the same manner as in Example 1, the viscosity of the composition according to Comparative Example 3 was 44 Pa·s.

As a result of measuring the transmittance of the sealing member in the same manner as in Example 1, the transmittance at a wavelength of 460 nm was 18%, and the transmittance at a wavelength of 600 nm was 29%.

In addition, as a result of measuring the average dispersed-particle diameter of the metal oxide particles in the sealing member according to Comparative Example 3 in the same manner as in Example 1, the average dispersed-particle diameter was 84 nm.

In addition, as a result of measuring the total luminous flux in the same manner as in Example 1 regarding the LED package according to Comparative Example 3, the total luminous flux was 59.8 lm. The result is shown in Table 1.

Comparative Example 4

A dispersion liquid according to Comparative Example 4 was obtained in the very same manner as in Example 1 except for the fact that zirconium oxide particles having an average primary particle diameter of 14 nm were used, the blade circumferential velocity was set to 10.0 m/s, and the cooling water temperature was set to 15° C. The power per unit mass obtained by dividing the power displayed on the bead mill device during the dispersion treatment by the amount of a slurry prepared was 8.2 kW/kg.

The particle diameters and the content of the liberated surface-modifying material were measured in the same manner as in Example 1. As a result, D50 was 28 nm, and D50/D90 was 0.17. In addition, the content of the liberated surface-modifying material was 55% by mass. The results are shown in Table 1.

A composition, a sealing member, and an LED package according to Comparative Example 4 were obtained in the same manner as in Example 1 except for the fact that the dispersion liquid according to Comparative Example 4 was used instead of the dispersion liquid according to Example 1.

As a result of measuring the transmittance of the composition in the same manner as in Example 1, the transmittance at a wavelength of 460 nm was 28%, and the transmittance at a wavelength of 600 nm was 39%.

As a result of measuring the viscosity of the composition in the same manner as in Example 1, the viscosity of the composition according to Comparative Example 4 was 60 Pa·s.

As a result of measuring the transmittance of the sealing member in the same manner as in Example 1, the transmittance at a wavelength of 460 nm was 20%, and the transmittance at a wavelength of 600 nm was 32%.

In addition, as a result of measuring the average dispersed-particle diameter of the metal oxide particles in the sealing member according to Comparative Example 4 in the same manner as in Example 1, the average dispersed-particle diameter was 39 nm.

In addition, as a result of measuring the total luminous flux in the same manner as in Example 1 regarding the LED package according to Comparative Example 4, the total luminous flux was 60.1 lm. The result is shown in Table 1.

Comparative Example 5

A dispersion liquid according to Comparative Example 5 was obtained in the same manner as in Example 1 except for the fact that zirconium oxide particles having an average primary particle diameter of 5 nm were used, the blade circumferential velocity was set to 6.0 m/s, and the cooling water temperature was set to 25° C. The power per unit mass obtained by dividing the power displayed on the bead mill device during the dispersion treatment by the amount of a slurry prepared was 2.6 kW/kg.

The particle diameters and the content of the liberated surface-modifying material were measured in the same manner as in Example 1. As a result, D50 was 13 nm, and D50/D90 was 0.23. In addition, the content of the liberated surface-modifying material was 41% by mass. The results are shown in Table 1.

A composition, a sealing member, and an LED package according to Comparative Example 5 were obtained in the same manner as in Example 1 except for the fact that the dispersion liquid according to Comparative Example 5 was used instead of the dispersion liquid according to Example 1.

As a result of measuring the transmittance of the composition in the same manner as in Example 1, the transmittance at a wavelength of 460 nm was 89%, and the transmittance at a wavelength of 600 nm was 93%.

As a result of measuring the viscosity of the composition in the same manner as in Example 1, the viscosity of the composition according to Comparative Example 5 was 13 Pa·s.

As a result of measuring the transmittance of the sealing member in the same manner as in Example 1, the transmittance at a wavelength of 460 nm was 34%, and the transmittance at a wavelength of 600 nm was 75%.

In addition, as a result of measuring the average dispersed-particle diameter of the metal oxide particles in the sealing member according to Comparative Example 5 in the same manner as in Example 1, the average dispersed-particle diameter was 21 nm.

In addition, as a result of measuring the total luminous flux in the same manner as in Example 1 regarding the LED package according to Comparative Example 5, the total luminous flux was 60.1 lm. The result is shown in Table 1.

TABLE 1

| | | | Example 1 | Example 2 | Example 3 | Example 4 | Example 5 | Comparative Example 1 |
|---|---|---|---|---|---|---|---|---|
| Production conditions | Blade circumferential velocity (m/s) | | 5.0 | 6.0 | 6.0 | 6.0 | 5.0 | 10.0 |
| | Cooling water temperature (° C.) | | 25 | 20 | 15 | 15 | 20 | 20 |
| | Power per unit mass (kW/kg) | | 1.4 | 2.3 | 2.2 | 2.1 | 1.6 | 8.5 |
| Dispersion liquid | Metal oxide particles | Kind | $ZrO_2$ | $ZrO_2$ | $ZrO_2$ | $TiO_2$ | $ZrO_2$ | $ZrO_2$ |
| | | Average primary particle diameter (nm) | 5 | 10 | 20 | 15 | 12 | 8 |
| | | D50(nm) | 32 | 48 | 57 | 51 | 51 | 22 |
| | | D50/D90 | 0.25 | 0.56 | 0.60 | 0.40 | 0.58 | 0.18 |
| | Content of liberated surface-modifying material (%) | | 40 | 45 | 50 | 42 | 15 | 61 |
| Composition | Transmittance at 460 nm (%) | | 84 | 58 | 41 | 38 | 54 | 75 |
| | Transmittance at 600 nm (%) | | 90 | 79 | 68 | 61 | 73 | 85 |
| | Viscosity (Pa · s) | | 10 | 7 | 4 | 9 | 175 | 30 |
| Sealing member | Transmittance at 460 nm (%) | | 25 | 15 | 10 | 19 | 13 | 38 |
| | Transmittance at 600 nm (%) | | 70 | 52 | 41 | 35 | 45 | 81 |
| | Average dispersed-particle diameter of metal oxide particles (nm) | | 55 | 85 | 128 | 110 | 98 | 28 |
| Total luminous flux of LED package (lm) | | | 61.2 | 61.3 | 61.7 | 61.4 | 61.3 | 60.0 |

TABLE 1-continued

|  |  |  | Comparative Example 2 | Comparative Example 3 | Comparative Example 4 | Comparative Example 5 |
|---|---|---|---|---|---|---|
| Production conditions | Blade circumferential velocity (m/s) | | 12.0 | 6.0 | 10.0 | 6.0 |
| | Cooling water temperature (° C.) | | 40 | 40 | 15 | 25 |
| | Power per unit mass (kW/kg) | | 12.9 | 4.7 | 8.2 | 2.6 |
| Dispersion liquid | Metal oxide particles | Kind | $ZrO_2$ | $ZrO_2$ | $ZrO_2$ | $ZrO_2$ |
| | | Average primary particle diameter (nm) | 33 | 18 | 14 | 5 |
| | | D50(nm) | 125 | 42 | 28 | 13 |
| | | D50/D90 | 0.15 | 0.18 | 0.17 | 0.23 |
| | Content of liberated surface-modifying material (%) | | 65 | 58 | 55 | 41 |
| Composition | Transmittance at 460 nm (%) | | 18 | 25 | 26 | 89 |
| | Transmittance at 600 nm (%) | | 29 | 37 | 39 | 93 |
| | Viscosity (Pa · s) | | 51 | 44 | 60 | 13 |
| Sealing member | Transmittance at 460 nm (%) | | 3 | 18 | 20 | 34 |
| | Transmittance at 600 nm (%) | | 21 | 29 | 32 | 75 |
| | Average dispersed-particle diameter of metal oxide particles (nm) | | 160 | 84 | 39 | 21 |
| Total luminous flux of LED package (lm) | | | 59.7 | 59.8 | 60.1 | 60.1 |

From the results of Examples 1 to 5 and Comparative Examples 1 to 5, it was confirmed that, when the dispersion liquid in which D50 of the metal oxide particles is 30 nm or more and 100 nm or less and D50/D90 is 0.20 or more is used, a light-emitting device having an excellent extraction efficiency of light can be obtained. In addition, when Comparative Examples 2 and 3 were referred to, it was confirmed that the extraction efficiency of light cannot be improved only by simply adjusting the average dispersed-particle diameter in the dispersion liquid or the sealing member without using the dispersion liquid according to the examples.

Furthermore, compared with the composition according to Example 5 in which the content of the liberated surface-modifying material was small, the compositions according to Examples 1 to 4 in which the content of the liberated surface-modifying material was relatively large have a significantly small viscosity. Such compositions of Examples 1 to 4 are easily handled during the sealing of a light-emitting element.

Hitherto, the preferred embodiment of the present invention has been described in detail with reference to the accompanying drawings, but the present invention is not limited to such examples. It is evident that a person skilled in the art to which the present invention belongs is able to imagine a variety of modification examples or correction examples within the scope of a technical idea described in the claims, and it is needless to say that those examples are also understood to be in the technical scope of the present invention.

The invention claimed is:

1. A dispersion liquid for sealing a light-emitting element, comprising:
   metal oxide particles having a refractive index of 1.7 or higher; and
   a surface-modifying material at least partially attached to the metal oxide particles,
   wherein a particle diameter D50 of the metal oxide particles when a cumulative percentage of a scattering intensity distribution obtained by a dynamic light scattering method is 50% is 30 nm or more and 100 nm or less, and
   a value D50/D90 obtained by dividing the particle diameter D50 of the metal oxide particles when the cumulative percentage of the scattering intensity distribution is 50% by a particle diameter D90 of the metal oxide particles when the cumulative percentage of the scattering intensity distribution is 90% is 0.20 or more,
   wherein a content of the surface-modifying material not attached to the metal oxide particles is 20% by mass or more and 53% by mass or less with respect to a total content of the metal oxide particles and the surface-modifying material.

2. The dispersion liquid according to claim 1,
   wherein the metal oxide particles include zirconium oxide particles and/or titanium oxide particles.

3. The dispersion liquid according to claim 1,
   wherein an average primary particle diameter of the metal oxide particles is 3 nm or more and 20 nm or less.

4. A composition for sealing a light-emitting element which is obtained by mixing the dispersion liquid according to claim 1 and a resin component.

5. A sealing member which is a cured substance of the composition according to claim 4.

6. A light-emitting device comprising:
   the sealing member according to claim 5; and
   a light-emitting element sealed by the sealing member.

7. An illumination tool comprising:
   the light-emitting device according to claim 6.

8. A display device comprising:
   the light-emitting device according to claim 6.

9. A method for producing a light-emitting device, comprising:
   a step of sealing a light-emitting element using the composition according to claim 4.

10. A method for producing a light-emitting device, comprising:
   a step of obtaining a composition by mixing the dispersion liquid according to claim and a resin component; and
   a step of sealing a light-emitting element using the composition.

* * * * *